(12) United States Patent
Kim et al.

(10) Patent No.: US 11,864,441 B2
(45) Date of Patent: Jan. 2, 2024

(54) TILED DISPLAY DEVICE AND METHOD OF MANUFACTURING THE SAME

(71) Applicant: Samsung Display Co., LTD., Yongin-si (KR)

(72) Inventors: Dongwoo Kim, Seoul (KR); Mun-Soo Park, Suwon-si (KR); Jonghwan Park, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 329 days.

(21) Appl. No.: 17/331,170

(22) Filed: May 26, 2021

(65) Prior Publication Data

US 2022/0077279 A1 Mar. 10, 2022

(30) Foreign Application Priority Data

Sep. 4, 2020 (KR) ........................ 10-2020-0113270

(51) Int. Cl.
*H10K 59/18* (2023.01)
*H10K 50/86* (2023.01)
*H10K 59/38* (2023.01)
*H10K 71/00* (2023.01)

(52) U.S. Cl.
CPC ........... *H10K 59/18* (2023.02); *H10K 50/865* (2023.02); *H10K 59/38* (2023.02); *H10K 71/00* (2023.02)

(58) Field of Classification Search
None
See application file for complete search history.

(56) References Cited

U.S. PATENT DOCUMENTS

| | | | |
|---|---|---|---|
| 2010/0156765 A1* | 6/2010 | Park | H10K 50/841 313/110 |
| 2016/0104752 A1* | 4/2016 | Oh | H10K 59/121 257/40 |
| 2017/0178595 A1* | 6/2017 | Kim | G09G 3/3275 |
| 2019/0172885 A1* | 6/2019 | Lee | H10K 59/50 |
| 2021/0225963 A1* | 7/2021 | Gong | G02F 1/136209 |

FOREIGN PATENT DOCUMENTS

KR 10-0740906 7/2007

* cited by examiner

*Primary Examiner* — Evren Seven
(74) *Attorney, Agent, or Firm* — KILE PARK REED & HOUTTEMAN PLLC

(57) ABSTRACT

A tiled display device includes a first display panel including a first display area and a first non-display area adjacent to the first display area, and a second display panel including a second display area and a second non-display area between the second display area and the first non-display area. The first display panel includes a first lower substrate, emitting diodes disposed on the first lower substrate and overlapping the first display area, a first upper substrate including a lower surface facing the first lower substrate, a first black matrix pattern disposed on the lower surface of the first upper substrate and overlapping the first non-display area, and a first photochromic matrix pattern disposed on the lower surface of the first upper substrate, overlapping the first non-display area, and transmitting light.

14 Claims, 12 Drawing Sheets

TILED DISPLAY DEVICE AND METHOD OF MANUFACTURING THE SAME

CROSS-REFERENCE TO RELATED APPLICATION(S)

This application claims priority to and the benefits of Korean Patent Application No. 10-2020-0113270 under 35 U.S.C. § 119, filed on Sep. 4, 2020 in the Korean Intellectual Property Office, the entire contents of which are hereby incorporated by reference.

BACKGROUND

1. Technical Field

Disclosed are relating to a tiled display device and a method of manufacturing the tiled display device. Particularly, the disclosure is directed to a tiled display device capable of displaying improved quality images and a method of manufacturing such tiled display device.

2. Description of the Related Art

A tiled display device generally has a structure such as display panels are connected to each other to constitute a large screen. Each of the display panels includes a display area and a non-display area surrounding the display area. A boundary area including the non-display area is defined between the display panels. Since no image is displayed in the boundary area, the boundary area is readily recognized by users. As a result, the display quality of a large screen having multiple display panels is deteriorated. Thus, there has been a desire to improve the display quality of a large screen of multiple display panels.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Disclosed are embodiments of a tiled display device and a method of manufacturing the tiled display device.

A tiled display device according to an embodiment may include a first display panel including a first display area and a first non-display area adjacent to the first display area, and a second display panel including a second display area and a second non-display area disposed between the second display area and the first non-display area. The first display panel may include a first lower substrate, a plurality of emitting diodes disposed on the first lower substrate and overlapping the first display area, a first upper substrate including a lower surface facing the first lower substrate, a first black matrix pattern disposed on the lower surface of the first upper substrate and overlapping the first non-display area, and a first photochromic matrix pattern disposed on the lower surface of the first upper substrate, overlapping the first non-display area, and transmitting light.

According to an embodiment, the first photochromic matrix pattern may contact the first black matrix pattern.

According to an embodiment, the first photochromic matrix pattern may not overlap the first display area.

According to an embodiment, the first black matrix pattern may include first patterns that extend in a first direction and are spaced apart from each other in a second direction intersecting the first direction, and the first photochromic matrix pattern may include second patterns that extend in the first direction and are spaced apart from each other in the second direction.

According to an embodiment, the first patterns and the second patterns may be alternately disposed one after another.

According to an embodiment, a width of each of the first patterns in the second direction may be smaller than a width of each of the second patterns in the second direction.

According to an embodiment, the first black matrix pattern may further include third patterns overlapping the first display area.

According to an embodiment, the width of each of the first patterns in the second direction may be substantially equal to a width of each of the third patterns in the second direction.

According to an embodiment, the width of each of the first patterns in the second direction may be smaller than a width of each of the third patterns in the second direction.

According to an embodiment, the first black matrix pattern may block light.

According to an embodiment, a color of the first photochromic matrix pattern may be vary in response to ultraviolet (UV) rays are irradiated onto the first photochromic matrix pattern.

According to an embodiment, the first display panel may further include color filters disposed on the lower surface of the first upper substrate, overlapping the first display area, and disposed between patterns of the first black matrix pattern, and color conversion patterns overlapping the color filters.

According to an embodiment, the tiled display device may further include a window disposed on the first display panel and the second display panel, and overlapping the first display area, the first non-display area, the second non-display area, and the second display area.

According to an embodiment, the second display panel may include a second lower substrate, a plurality of emitting diodes disposed on the second lower substrate and overlapping the second display area, a second upper substrate including a lower surface facing the second lower substrate, a second black matrix pattern disposed on the lower surface of the second upper substrate and overlapping the second non-display area, and a second photochromic matrix pattern disposed on the lower surface of the second upper substrate, overlapping the second non-display area, and transmitting light.

A method of manufacturing a tiled display device according to an embodiment may include preparing a first lower substrate, forming a first photochromic matrix layer on a lower surface of a first upper substrate, disposing the first upper substrate on the first lower substrate so that the lower surface of the first upper substrate faces the first lower substrate, selectively irradiating ultraviolet (UV) rays to the first photochromic matrix layer, and forming a black matrix pattern and a photochromic matrix pattern by discoloring the first photochromic layer.

According to an embodiment, the forming of the black matrix pattern and the photochromic matrix pattern may comprise discoloring the first photochromic matrix layer by irradiating the ultraviolet (UV) rays to form the black matrix pattern, and forming the photochromic matrix pattern by not irradiating ultraviolet rays onto the first photochromic matrix layer.

According to an embodiment, the selectively irradiating the ultraviolet (UV) rays may be performed after the disposing of the first upper substrate on the first lower substrate.

According to an embodiment, the method may further include forming emitting diodes on a second lower substrate, preparing a second upper substrate including a lower surface, forming a second photochromic matrix layer on the lower surface of the second upper substrate, disposing the second upper substrate on the second lower substrate so that the lower surface of the second upper substrate faces the second lower substrate, and forming a window on the first upper substrate and the second upper substrate. The selectively irradiating the ultraviolet (UV) rays may be performed after the forming of the window.

According to an embodiment, the method may further include, after the forming of the first photochromic matrix layer, removing a portion of the first photochromic matrix layer to expose at least part of the lower surface of the first upper substrate, forming color filters on the exposed at least part of the lower surface of the first upper substrate, and forming color conversion patterns on the color filters.

According to an embodiment, the method may further include forming a transistor layer on the first lower substrate, forming emitting diodes on the transistor layer, and forming an encapsulation layer overlapping the emitting diodes.

As described above, the tiled display device according to embodiments may include multiple (for example, first and second) display panels, and may also include a first photochromic matrix pattern, a second photochromic matrix pattern, a first black matrix pattern, and a second black matrix pattern which overlap non-display areas of the display panels. Since the first photochromic matrix pattern and the second photochromic matrix pattern may transmit light, a user may not recognize the non-display areas.

In the method of manufacturing the tiled display according to embodiments, the black matrix patterns may be formed by discoloring the photochromic matrix layers. For example, the photochromic matrix layers may be partially discolored by ultraviolet rays that are selectively irradiated, and the discolored photochromic matrix layers may form the black matrix patterns. Accordingly, the black matrix patterns may be formed after windows are formed on the display panels, and may be formed to have various shapes as necessary.

It is to be understood that both the foregoing general description and the following detailed description are explanatory and are intended to provide the description of the embodiments.

BRIEF DESCRIPTION OF THE DRAWINGS

The accompanying drawings, which are included to provide a further understanding of the invention and are incorporated in and constitute a part of this specification, illustrate embodiments of the invention.

DETAILED DESCRIPTION OF THE EMBODIMENTS

Figure 1:
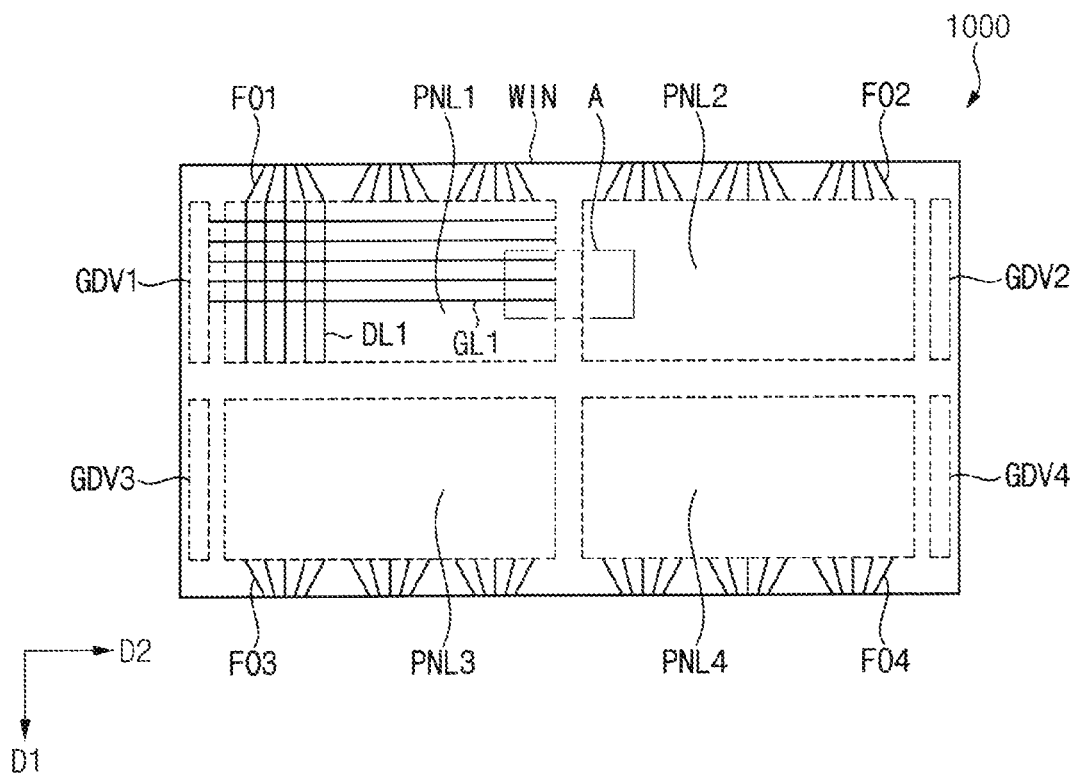
FIG. 1 is a plan view illustrating an upper surface of a tiled display device according to an embodiment.

Illustrative, non-limiting embodiments will be more clearly understood from the following detailed description in conjunction with the accompanying drawings.

Unless otherwise specified, the illustrated embodiments are to be understood as providing examples of varying detail of some ways in which the disclosure may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the spirit and the scope of the disclosure.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements.

The terms "and" and "or" may be used in the conjunctive or disjunctive sense and may be understood to be equivalent to "and/or." In the specification and the claims, the phrase "at least one of" is intended to include the meaning of "at least one selected from the group of" for the purpose of its meaning and interpretation. For example, "at least one of A and B" may be understood to mean "A, B, or A and B.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (for example, as in "sidewall"), and the like, may be used herein for descriptive purposes, and, thereby, to describe one or an elements' relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features may then be oriented "above" the other elements or features. Thus, the example term "below" can encompass both an orientation of above and below. Furthermore, the apparatus may be otherwise oriented (for example, rotated 90 degrees or at other orientations), and, as such, the spatially relative descriptors used herein interpreted accordingly.

Additionally, the terms "overlap" or "overlapped" mean that a first object may be above or below or to a side of a second object, and vice versa. Additionally, the term "overlap" may include layer, stack, face or facing, extending over, covering or partly covering or any other suitable term as would be appreciated and understood by those of ordinary skill in the art. The terms "face" and "facing" mean that a first element may directly or indirectly oppose a second element. In a case in which a third element intervenes between the first and second element, the first and second element may be understood as being indirectly opposed to one another, although still facing each other. When an element is described as 'not overlapping' or 'to not overlap' another element, this may include that the elements are spaced apart from each other, offset from each other, or set aside from each other or any other suitable term as would be appreciated and understood by those of ordinary skill in the art.

"About," "approximately," or "substantially" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Figure 2:
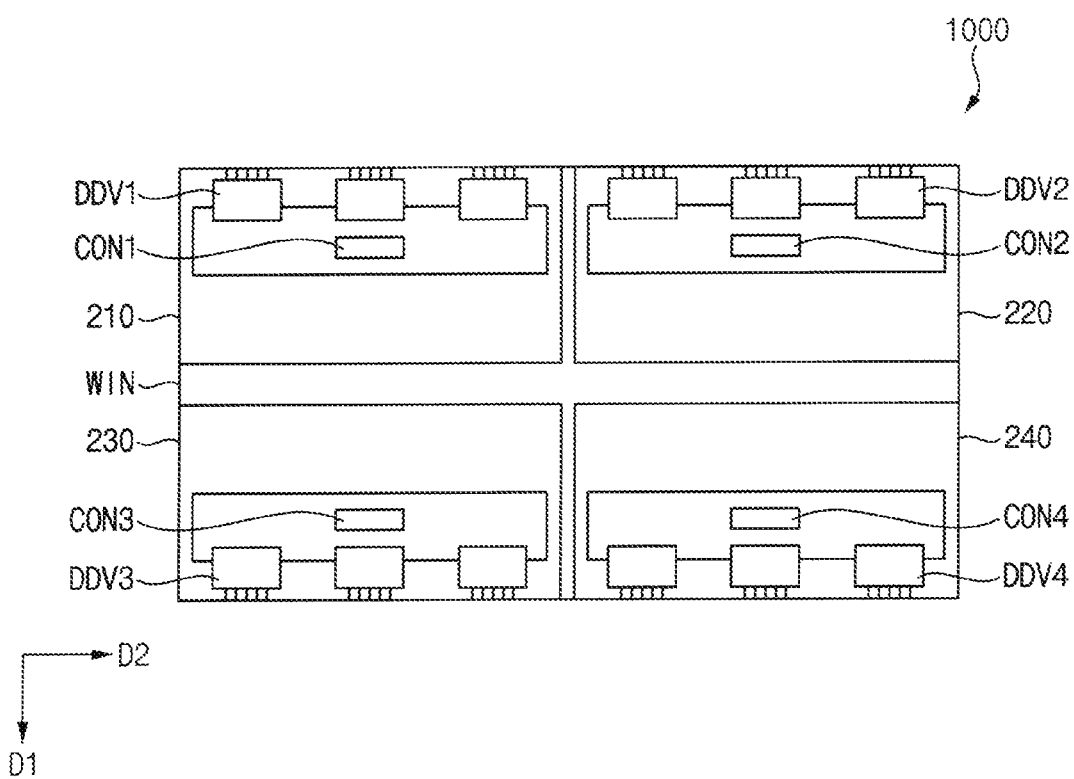
FIG. 2 is a plan view illustrating a lower surface of the tiled display device of FIG. 1.

FIG. 1 is a plan view illustrating an upper surface of a tiled display device according to an embodiment. FIG. 2 is a plan view illustrating a lower surface of the tiled display device of FIG. 1.

Referring to FIGS. 1 and 2, a tiled display device 1000 according to an embodiment may include display panels, a window disposed on the display panels, gate drivers, data drivers, and controllers.

In an embodiment, the tiled display device 1000 may include a first display panel PNL1, a second display panel PNL2, a third display panel PNL3, and a fourth display panel PNL4. The first to fourth display panels PNL1, PNL2, PNL3, and PNL4 may include first to fourth lower substrates 210, 220, 230, and 240, respectively. The first display panel PNL1 may display a first image, the second display panel PNL2 may display a second image, the third display panel PNL3 may display a third image, and the fourth display panel PNL4 may display a fourth image. The user may view an image in which the first to fourth images are combined. In an embodiment, the first to fourth display panels PNL1, PNL2, PNL3, and PNL4 may have substantially the same structure. Hereinafter, the first display panel PNL1 will be mainly described, and each of the second to fourth display panels PNL2, PNL3, and PNL4 may have substantially the same structure as the first display panel PNL1.

In an embodiment, the tiled display device 1000 may include a first gate driver GDV1, a second gate driver GDV2, a third gate driver GDV3, and a fourth gate driver GDV4. Hereinafter, the first gate driver GDV1 will be mainly described, and each of the second to fourth gate drivers GDV2, GDV3, and GDV4 may substantially correspond to the first gate driver GDV1.

The first gate driver GDV1 may generate a first gate signal. The first gate signal may be provided to the first display panel PNL1 through first gate lines GL1. The first gate signal may turn on or off transistors included in the first display panel PNL1. For example, the first gate driver GDV1 may be mounted on the peripheral portion of the tiled display device 1000, but the location of the first gate driver GDV1 is not limited thereto.

In an embodiment, the tiled display device 1000 may include a first data driver DDV1, a second data driver DDV2, a third data driver DDV3, and a fourth data driver DDV4. The tiled display device 1000 may include first fan-out lines FO1, second fan-out lines FO2, third fan-out lines FO3, and fourth fan-out lines F04. Hereinafter, the first data driver DDV1 and the first fan-out lines FO1 will be mainly described, and each of the second to fourth data drivers DDV2, DDV3 and DDV4 and each of the second to fourth fan-out lines FO2, FO3 and FO4 may substantially correspond to the first data driver DDV1 and the first fan-out lines FO1, respectively.

The first data driver GDV1 may generate a first data voltage. The first data voltage may be provided to the first display panel PNL1 through the first fan-out lines FO1 and the first data lines DLL The first data voltage may be provided to the transistors, and the transistors may provide driving current to first emitting diodes included in the first display panel PNL1. For example, the first data driver DDV1 may be disposed on a flexible printed circuit board, and the flexible printed circuit board may be disposed on a rear surface of the tiled display device 1000, but the locations of the first data driver DDV1 and the flexible printed circuit board are not limited thereto.

In an embodiment, the tiled display device 1000 may include a first controller CON1, a second controller CON2, a third controller CON3, and a fourth controller CON4. Hereinafter, the first controller CON1 will be mainly described, and each of the second to fourth controllers CON2, CON3, and CON4 may substantially correspond to the first controller CON1.

The first controller CON1 may control the first gate driver GDV1 and the first data driver DDV1. For example, the first controller CON1 may generate a first gate control signal, a first data control signal, and first image data. The first gate control signal may be provided to the first gate driver GDV1, and the first data control signal and the first image data may be provided to the data driver DDV. For example, the first controller CON1 may be disposed on the flexible printed circuit board, and the flexible printed circuit board may be disposed on the rear surface of the tiled display device 1000, but the locations of the first controller CON1 and the flexible printed circuit board are not limited thereto.

Figure 3:
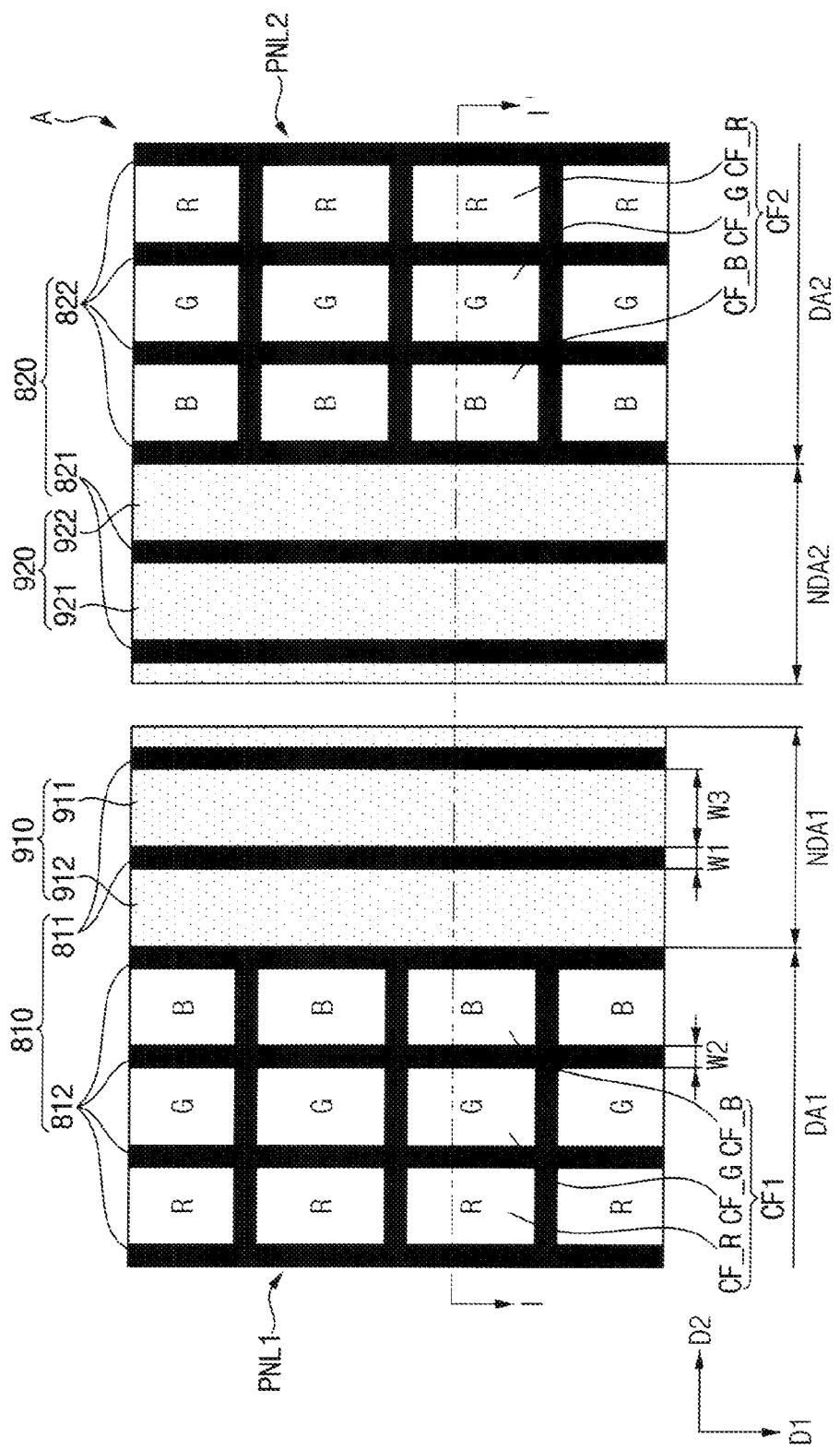
FIG. 3 is an enlarged view of area A of FIG. 1.

FIG. 3 is an enlarged view of area A of FIG. 1.

Referring to FIGS. 1 and 3, the first display panel PNL1 may include a first display area DA1 and a first non-display area NDA1 adjacent to the first display area DA1. For example, when viewed from the front of the tiled display device 1000, the first non-display area NDA1 may be positioned to surround the first display area DA1.

The second display panel PNL2 may include the second display area DA2 and a second non-display area NDA2 between the second display area DA2 and the first non-display area NDA1. For example, when viewed from the front of the tiled display device 1000, the second non-display area NDA2 may be positioned to surround the second display area DA2.

The first display panel PNL1 may include first color filters CF1 overlapping the first display area DA1. For example, the first color filters CF1 may include a red color filter CF_R, a green color filter CF_G, and a blue color filter CF_B. However, the arrangement structure of the first color filters CF1 is not limited thereto.

The first display panel PNL1 may include a first black matrix pattern 810. In an embodiment, the first black matrix pattern 810 may include patterns extending in a first direction D1 and spaced apart from each other in a second direction D2 crossing the first direction D1. For example, the patterns may include first patterns 811 overlapping the first non-display area NDA1 and second patterns 812 overlapping the first display area DA1.

The first display panel PNL1 may include a first photochromic matrix pattern 910. In an embodiment, the first photochromic matrix pattern 910 may include patterns extending in the first direction D1 and spaced apart from each other in the second direction D2. For example, the patterns may include a third pattern 911 and a fourth pattern 912. The first photochromic matrix pattern 910 may overlap the first non-display area NDA1 and may not overlap the first display area DA1.

In an embodiment, the third pattern 911 may be disposed between the first patterns 811, and the fourth pattern 912 may be disposed between the first pattern 811 and the second pattern 812 that are adjacent to each other. For example, the third and fourth patterns 911 and 912 may be alternately disposed between the first patterns 811. The third pattern 911 and the fourth pattern 912 may be spaced apart each other in the second direction D2 and a first pattern 811 may be disposed between the third pattern 911 and the fourth pattern 912.

In an embodiment, a first width W1 of each of the first patterns 811 in the second direction D2 may be substantially equal to a second width W2 of each of the second patterns 812 in the second direction D2. The first width W1 may be smaller than a third width W3 of the third pattern 911 in the second direction D2. The third width W3 of the third pattern 911 and a fourth width of the fourth pattern 912 may be substantially the same.

The second display panel PNL2 may have substantially the same structure as the first display panel PNL1, and the first display panel PNL1 and the second display panel PNL2 may be substantially symmetrical to each other.

In detail, the second display panel PNL2 may include second color filters CF2 overlapping the second display area DA2. For example, the second color filters CF2 may include a red color filter CF_R, a green color filter CF_G, and a blue color filter CF_B. However, the arrangement structure of the second color filters CF2 is not limited thereto.

In addition, the second display panel PNL2 may include a second black matrix pattern 820. In an embodiment, the second black matrix pattern 820 may include patterns extending in the first direction D1 and spaced apart from each other in the second direction D2. For example, the patterns may include fifth patterns 821 overlapping the second non-display area NDA2 and sixth patterns 822 overlapping the second display area DA2.

In addition, the second display panel PNL2 may include a second photochromic matrix pattern 920. In an embodiment, the second photochromic matrix pattern 920 may include patterns extending in the first direction D1 and spaced apart from each other in the second direction D2. For example, the patterns may include a seventh pattern 921 and an eighth pattern 922. The second photochromic matrix pattern 920 may overlap the second non-display area NDA2 and may not overlap the second display area DA2.

In an embodiment, the seventh pattern 921 may be disposed between the fifth patterns 821, and the eighth pattern 922 may be disposed between the fifth pattern 821 and the sixth pattern 822 that are adjacent to each other. For example, the seventh and eighth patterns 921 and 922 may be alternately disposed between the fifth patterns 821.

In an embodiment, a fifth width of each of the fifth patterns 821 in the second direction D2 may be substantially equal to a sixth width of each of the sixth patterns 822 in the second direction D2. The fifth width may be smaller than a seventh width of the seventh pattern 921 in the second direction D2. The seventh width of the seventh pattern 921 and an eighth width of the eighth pattern 922 may be substantially the same.

However, the shapes of the first black matrix pattern 810, the first photochromic matrix pattern 910, the second black matrix pattern 820, and the second photochromic matrix pattern 920 are not limited to those described above. The shapes of the first to eighth patterns 811, 821, 911, 912, 821, 822, 921, and 922 are not limited to those described above. In the method of manufacturing a tiled display device according to embodiments to be described later, the shapes of the first black matrix pattern 810, the first photochromic matrix pattern 910, the second black matrix pattern 820, and the second photochromic matrix pattern 920 may be formed as necessary.

Figure 4:
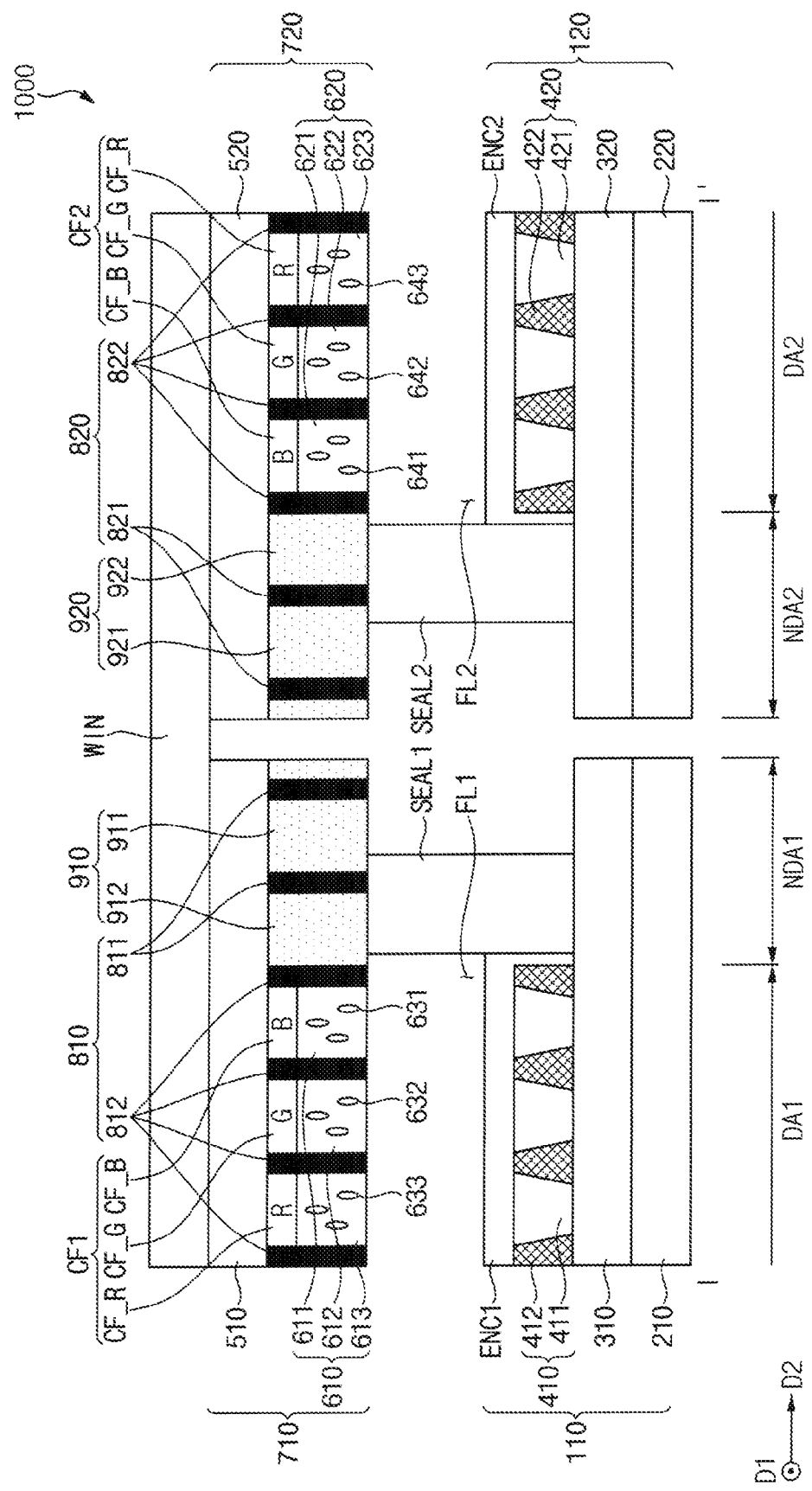
FIG. 4 is a schematic cross-sectional view taken along line I-I' of FIG. 3.
Figure 5:
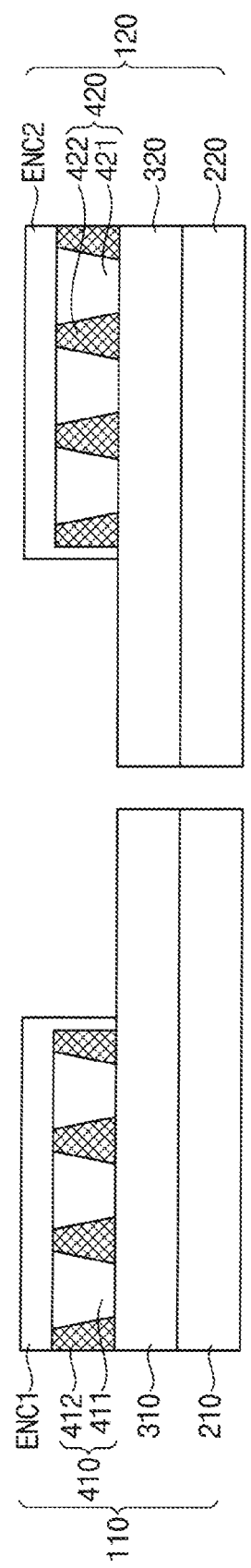
FIGS. 5, 6, 7, 8, 9, 10, and 11 are schematic cross-sectional views illustrating a method of manufacturing the tiled display device of FIG. 4.
Figure 6:
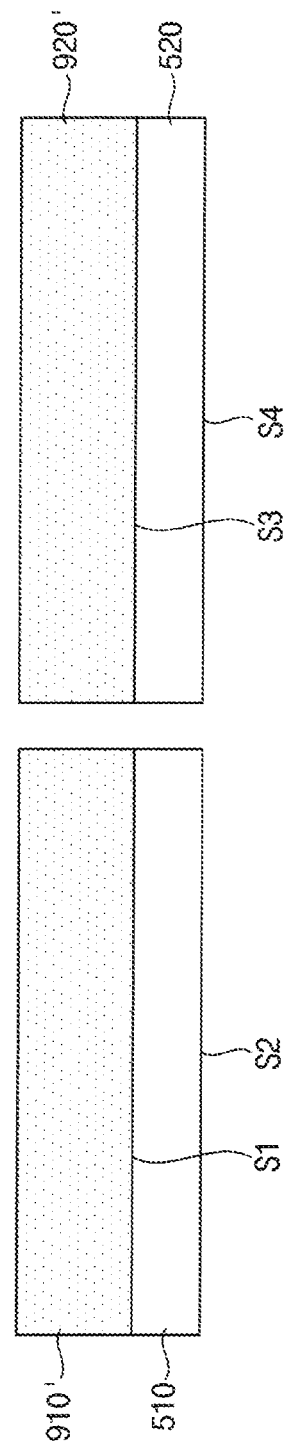
Figure 7:
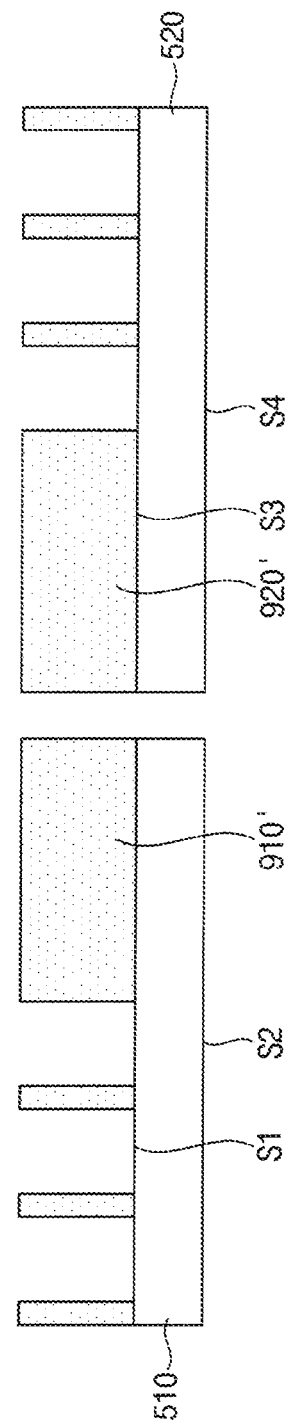
Figure 8:
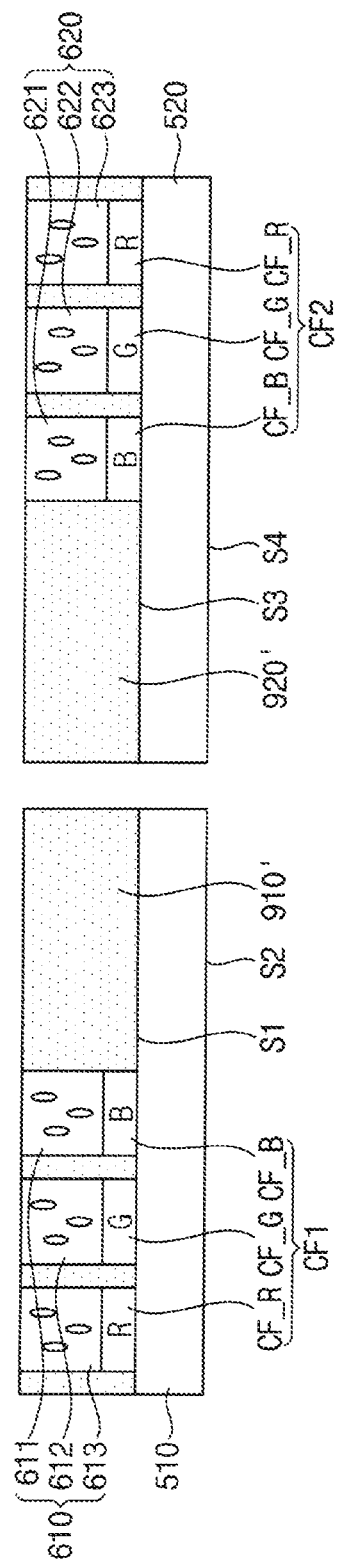

FIG. 4 is a schematic cross-sectional view taken along line I-I' of FIG. 3.

Referring to FIGS. 1, 3, and 4, the tiled display device 1000 may include the first display panel PNL1, the second display panel PNL2, and the window WIN. In an embodiment, the window WIN may be disposed on the first to fourth display panels PNL1, PNL2, PNL3, and PNL4. For example, the window WIN may overlap the first display area DA1, the first non-display area NDA1, the second non-display area NDA2, and the second display area DA2.

The first display panel PNL1 may include a first lower structure 110, a first sealing member SEAL1, and a first upper structure 710. The first lower structure 110 may include a first lower substrate 210, a first transistor layer 310, a first emission layer 410, and a first encapsulation layer ENC1. The first upper structure 710 may include a first upper substrate 510, the first color filters CF1, a first color conversion layer 610, the first black matrix pattern 810, and the first photochromic matrix pattern 910.

The first lower substrate 210 may include a transparent or opaque material. For example, the first lower substrate 210 may include glass, quartz, plastic, or the like. In an embodiment, the first lower substrate 210 may include rigid glass. The lower substrate 210 may include a buffer layer. The buffer layer may prevent impurities from penetrating into the first transistor layer 310.

The first transistor layer 310 may be disposed on the first lower substrate 210. The first transistor layer 310 may include the transistors. For example, the first transistor layer 310 may include metal patterns vertically stacked each other and insulating layers insulating the metal patterns from each other. The first transistor layer 310 may be driven according to the gate signal, may generate a driving current based on the data voltage, and may provide the driving current to the first emission layer 410.

The first emission layer 410 may be disposed on the first transistor layer 310. The first emission layer 410 may include first emitting diodes 411 and a first pixel defining layer 412. The first emission layer 410 may emit light. For example, the first emitting diodes 411 may be at least one of an organic light emitting diode, a quantum-nano light emitting diode, and a micro light emitting diode. Openings partially exposing an upper surface of the first transistor layer 310 may be formed in the first pixel defining layer 412, and the openings may define emission areas of the first emitting diodes 411.

The first encapsulation layer ENC1 may be disposed on the first emission layer 410. The first encapsulation layer ENC1 may cover the first emission layer 410 and may prevent impurities from penetrating into the first emission layer 410. For example, the first encapsulation layer ENC1 may have a structure in which inorganic layers and organic layers are alternately arranged.

The first sealing member SEAL1 may be disposed to surround a peripheral portion of the first lower substrate 210. The first sealing member SEAL1 may prevent impurities from penetrating into the first display panel PNL1. In an embodiment, the first sealing member SEAL1 may transmit light.

A first filler FL1 may be disposed between the first lower structure 110 and the first upper structure 710. The first filler FL1 may be appropriately selected in consideration of the refractive index of light emitted from the first emission layer 410. For example, the first filler FL1 may be air.

Figure 9:
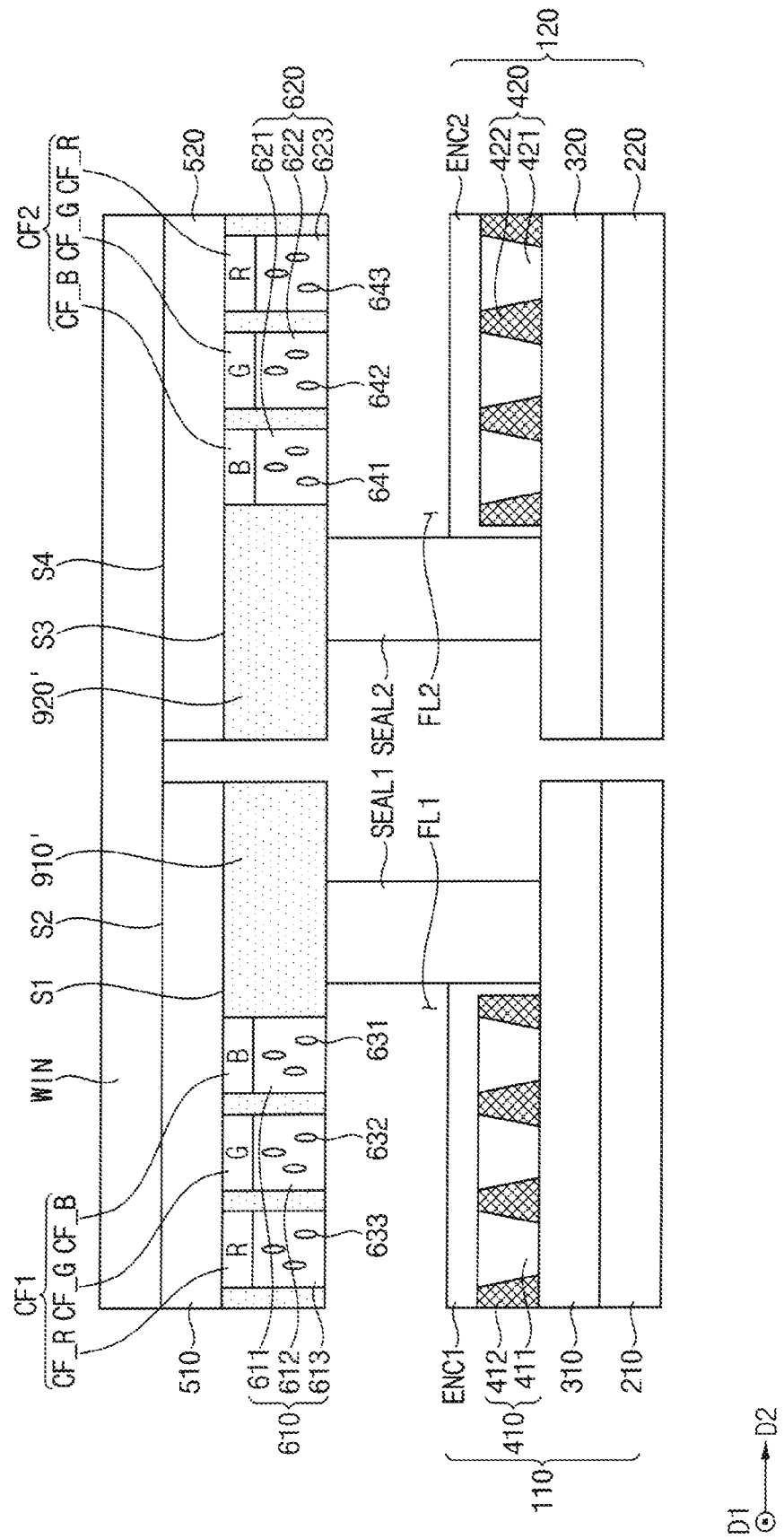
Figure 10:
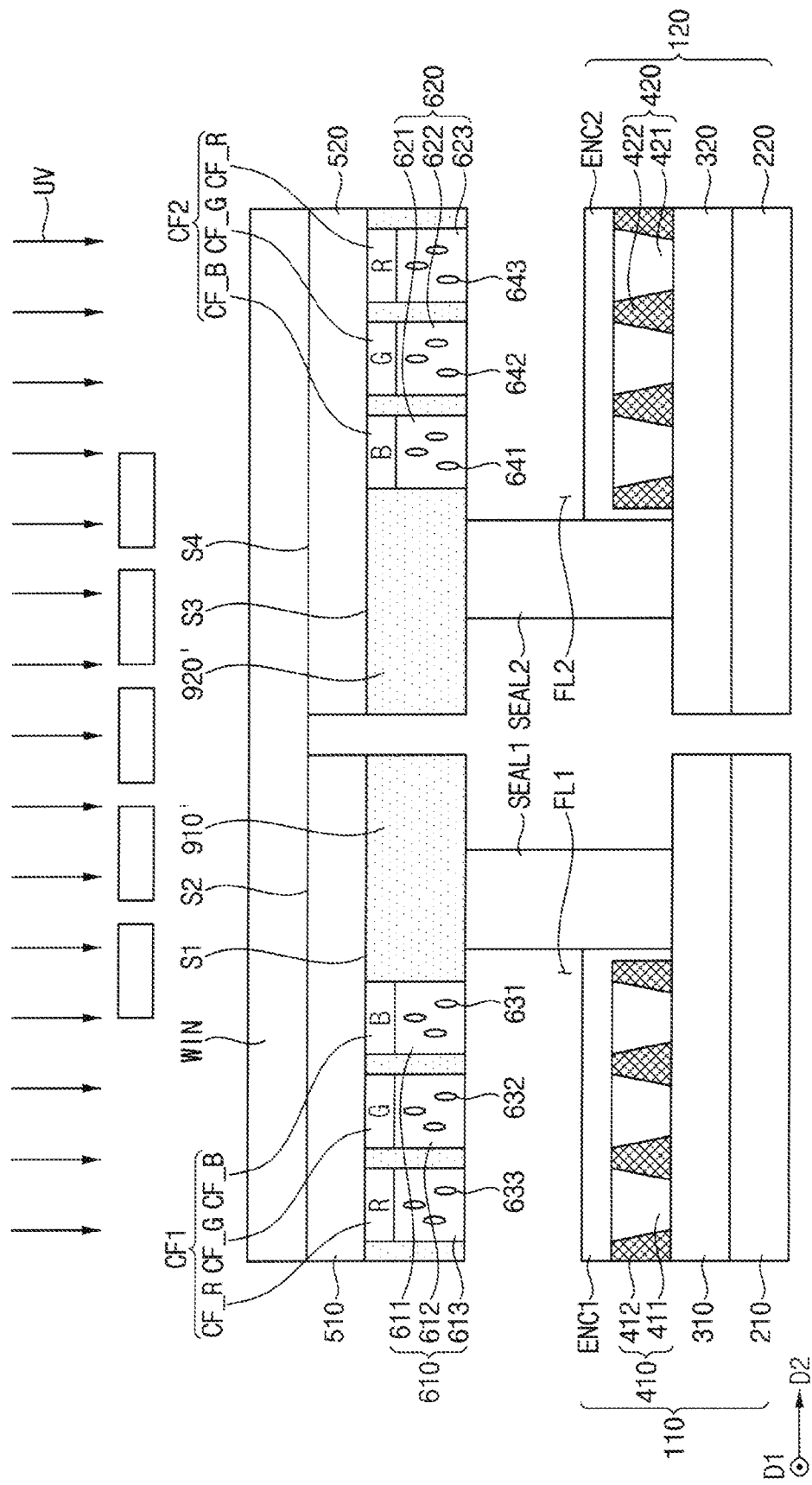
Figure 11:
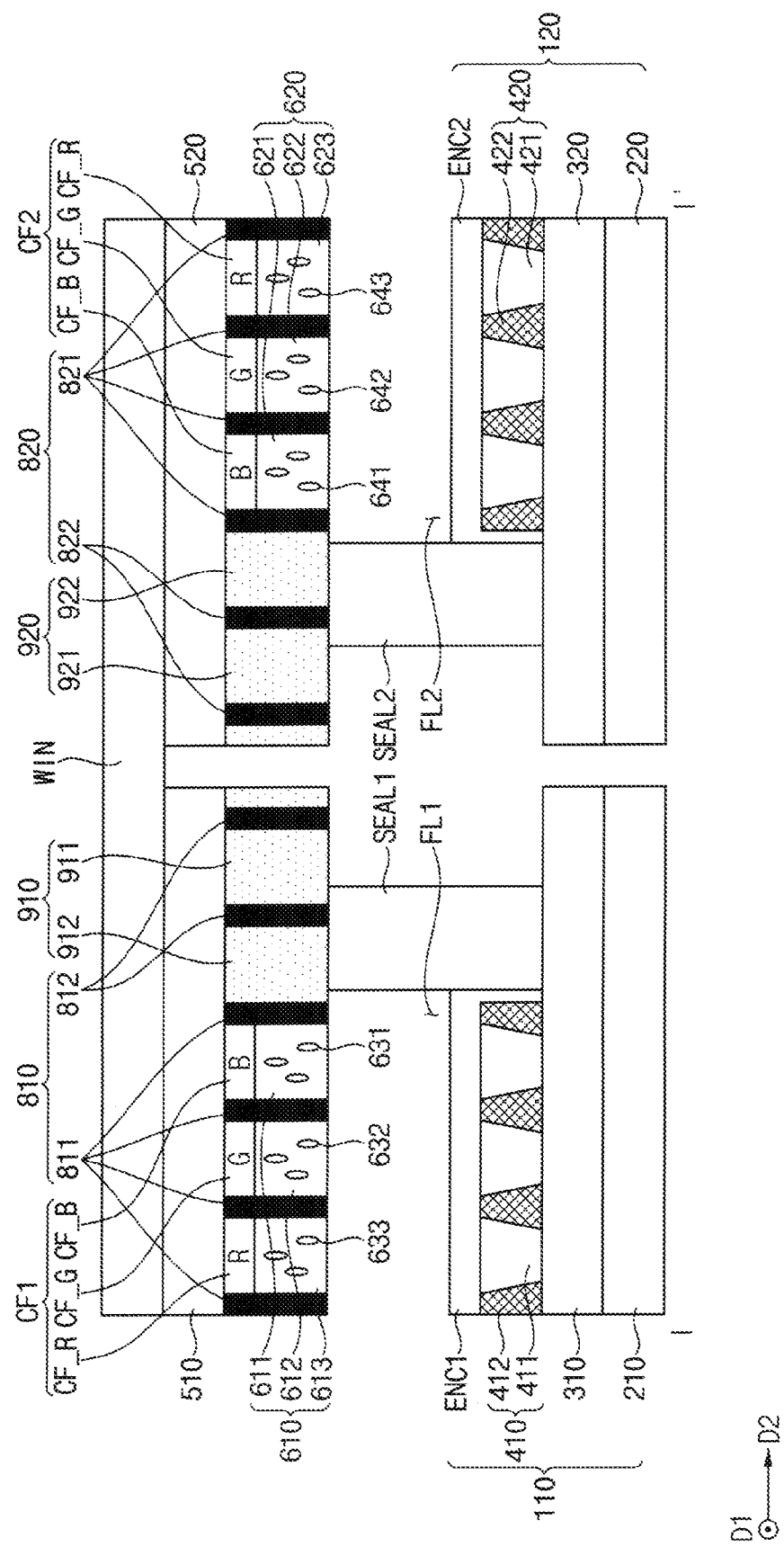

The first upper substrate 510 may face the first lower substrate 210. The first upper substrate 510 may include a first lower surface S1 (see FIG. 9) facing the first lower substrate 210 and a first upper surface S2 (see FIG. 9) opposite to the first lower surface S1. For example, the first upper substrate 510 may include a transparent material. For example, the first upper substrate 510 may include glass, quartz, plastic, or the like. In an embodiment, the first upper substrate 510 may include rigid glass.

The first color filters CF1 may be disposed on the first lower surface S1 of the first upper substrate 510. The first color filters CF1 may include the blue color filter CF_B, the green color filter CF_G, and the red color filter CF_R. In an embodiment, the blue color filter CF_B may transmit blue light, the green color filter CF_G may transmit green light, and the red color filter CF_R may transmit red light. However, the first color filters CF1 of the invention are not limited thereto.

The first color conversion layer 610 may be disposed on a lower surface of the first color filters CF1. The first color conversion layer 610 may include color conversion patterns. The color conversion patterns may overlap the first color filters CF1, respectively. For example, the first color conversion layer 610 may include a first color conversion pattern 611 overlapping the blue color filter CF_B, and a second color conversion pattern 612 overlapping the green color filter CF_G, and a third color conversion pattern 613 overlapping the red color filter CF_R.

The first color conversion pattern 611 may scatter the light emitted from the first emitting diodes 411. For example, the first color conversion pattern 611 may include a first material 631 (for example, a scattering material) that induces scattering of incident light. The second color conversion pattern 612 may convert the light emitted from the first emitting diodes 411 into green light. For example, the second color conversion pattern 612 may include a second material 632 (for example, a color conversion material) that converts a peak wavelength of incident light into a preset peak wavelength. The third color conversion pattern 613 may convert the light emitted from the first emitting diodes 411 into red light. For example, the third color conversion pattern 613 may include a third material 633 (for example, another color conversion material) that converts a peak wavelength of incident light into a preset peak wavelength. In an embodiment, the second material 632 and the third material 633 may include at least one of a quantum dot and a phosphor. However, the first to third color conversion patterns 611, 612, and 613 of the invention are not limited to those described above.

The first black matrix pattern 810 may be disposed on the lower surface S1 (see FIG. 9) of the first upper substrate 510. The first black matrix pattern 810 may block light. In an embodiment, the first black matrix pattern 810 may include the first patterns 811 and the second patterns 812. The second patterns 812 may partition a region in which the first to third color conversion patterns 611, 612, and 613 are disposed. The first to third color conversion patterns 611, 612 and 613 may be disposed between the second patterns 812. As described above, the width of each of the first patterns 811 may be substantially equal to the width of each of the second patterns 812. Accordingly, the user may not recognize the first non-display area NDA1.

The first photochromic matrix pattern 910 may be disposed on the lower surface S1 (see FIG. 9) of the first upper substrate 510. The first photochromic matrix pattern 910 may transmit light. In an embodiment, the light emitted from the first emitting diodes 411 may pass through the first photochromic matrix pattern 910. Accordingly, the light may be emitted through the first non-display area NDA1, and the user may not recognize the first non-display area NDA1.

The second display panel PNL2 may include a second lower structure 120, a second sealing member SEAL2, a second filler FL2, and a second upper structure 720. The second lower structure 120 may include a second lower substrate 220, a second transistor layer 320, a second emission layer 420, and a second encapsulation layer ENC2. The second emission layer 420 may include second emitting diodes 421 and a second pixel defining layer 422.

The second upper structure 720 may include a second upper substrate 520, the second color filters CF2, a second color conversion layer 620, the second black matrix pattern 820, and the second photochromic matrix pattern 920. The second upper substrate 520 may include a second lower surface S3 (see FIG. 9) facing the second lower substrate 220 and a second upper surface S4 (see FIG. 9) opposite to the second lower surface S3. The second color filters CF2 may include a blue color filter CF_B, a green color filter CF_G, and a red color filter CF_R. The second color conversion layer 620 may include a fourth color conversion pattern 621, a fifth color conversion pattern 622, and a sixth color conversion pattern 623. The fourth color conversion pattern 621 may include a fourth material 641 (for example, a scattering material) scattering light, and the fifth color conversion pattern 622 may include a fifth material 642 (for example, a color conversion material) converting light into green light, and the sixth color conversion pattern may include a sixth material 643 (for example, another color conversion material) converting light into red light. The second black matrix pattern 820 may include the third patterns 821 and the fourth patterns 822.

Since the second display panel PNL2 may have substantially the same structure as the first display panel PNL1, a detailed description will be omitted.

FIGS. 5, 6, 7, 8, 9, 10, and 11 are schematic cross-sectional views illustrating a method of manufacturing the tiled display device of FIG. 4.

Referring to FIGS. 1, 3, 4 and 5, the first lower structure 110 and the second lower structure 120 may be formed. In detail, the first transistor layer 310 may be formed on the first lower substrate 210, the first emission layer 410 may be formed on the first transistor layer 310, and the first encapsulation layer ENC1 may be formed on the first emission layer 410. The second transistor layer 320 may be formed on the second lower substrate 220, the second emission layer 420 may be formed on the second transistor layer 320, and the second encapsulation layer ENC2 may be formed on the second emission layer 420.

Referring to FIGS. 1, 3, 4, and 6, a first photochromic matrix layer 910' may be formed on the lower surface S1 of the first upper substrate 510. The first photochromic matrix layer 910' may include a material that changes color to black when ultraviolet rays are irradiated. For example, the first photochromic matrix layer 910' may include a polymer compound including a monomer to which color-changing particles are added. A second photochromic matrix layer 920' may be formed on the second lower surface S3 of the second upper substrate 520. The second photochromic matrix layer 920' may include substantially the same material as the first photochromic matrix layer 910'.

Referring to FIGS. 1, 3, 4, and 7, a portion of the first photochromic matrix layer 910' may be removed. For example, the portion of the first photochromic matrix layer 910' may be removed by an etching process such as a photoresist process, a wet etch process, and a dry etch process. Accordingly, a portion of the first lower surface S1 of the first upper substrate 510 may be exposed. In addition, a portion of the second photochromic matrix layer 920' may be removed. For example, the portion of the second photochromic matrix layer 920' may be removed by the etching process. Accordingly, a portion of the second lower surface S3 of the second upper substrate 520 may be exposed.

Referring to FIGS. 1, 3, 4, and 8, the first color filters CF1 and the first color conversion layer 610 may be formed on the exposed first lower surface S1 of the first upper substrate 510, corresponding to the removed portion of the first photochromic matrix layer 910'. The second color filters CF2 and the second color conversion layer 620 may be formed on the exposed second lower surface S3 of the second upper substrate 520, corresponding to the removed portion of the second photochromic matrix layer 920'.

Referring to FIGS. 1, 3, 4, and 9, the first upper substrate 510 may be disposed on the first lower substrate 210 so that the first lower surface S1 of the first upper substrate 510 and the first lower substrate 210 face each other. The first sealing member SEAL1 may be formed so that the first upper substrate 510 is stably disposed on the first lower substrate 210 and impurities do not penetrate into the first display panel PNL1.

The second upper substrate 520 may be disposed on the second lower substrate 220 so that the second lower surface S3 of the second upper substrate 520 and the second lower substrate 220 face each other. The second sealing member SEAL2 may be formed so that the second upper substrate 520 is stably disposed on the second lower substrate 220 and impurities do not penetrate into the second display panel PNL2.

The window WIN may be formed on the first upper surface S2 of the first upper substrate 510 and the second upper surface S4 of the second upper substrate 520.

Referring to FIGS. 1, 3, 4, and 10, ultraviolet rays UV may be selectively irradiated to the first and second photochromic matrix layers 910' and 920'. Colors of the first and second photochromic matrix layers 910' and 920' may vary in response to the ultraviolet rays UV. When the first and second photochromic matrix layers 910' and 920' are irradiated with the ultraviolet rays UV as described above, the first and second photochromic matrix layers 910' and 920' may turn black. For example, the first and second photochromic matrix layers 910' and 920' may be selectively discolored by using a mask that blocks or transmits the ultraviolet rays UV.

Referring to FIGS. 1, 3, 4, 10, and 11, the first and second photochromic matrix layers 910' and 920' irradiated with the ultraviolet rays UV may be discolored. In detail, the first photochromic matrix layer 910' irradiated with the ultraviolet rays UV may be discolored, and accordingly, the first black matrix pattern 810 may be formed. The first photochromic matrix layer 910' not irradiated with the ultraviolet rays UV may not be discolored, and thus the first photochromic matrix pattern 910 may be formed. The second photochromic matrix layer 920' irradiated with ultraviolet rays UV may be discolored, and accordingly, the second black matrix pattern 820 may be formed. The second photochromic matrix layer 920' not irradiated with ultraviolet rays UV may not be discolored, and accordingly, the second photochromic matrix pattern 920 may be formed.

The tiled display device 1000 according to an embodiment may include a photochromic matrix pattern and a black matrix pattern. In detail, the tiled display device 1000 may include the first photochromic matrix pattern 910, the second photochromic matrix pattern 920, the first black matrix pattern 810, and the second black matrix pattern 820 which overlap the first and second non-display areas NDA1 and NDA2 of the first and second display panels PNL1 and PNL2. Since the first photochromic matrix pattern 910 and the second photochromic matrix pattern 920 may transmit light, a user may not recognize the first and second non-display areas NDA1 and NDA2.

In the method of manufacturing the tiled display device 1000, the first and second black matrix patterns 810 and 820 may be formed by discoloring the first and second photochromic matrix layers 910' and 920'. For example, the first and second photochromic matrix layers 910' and 920' may be discolored by ultraviolet rays UV. The first and second black matrix patterns 810 and 820 may be formed after the window WIN is formed, and may be formed to have various shapes as necessary.

Figure 12:
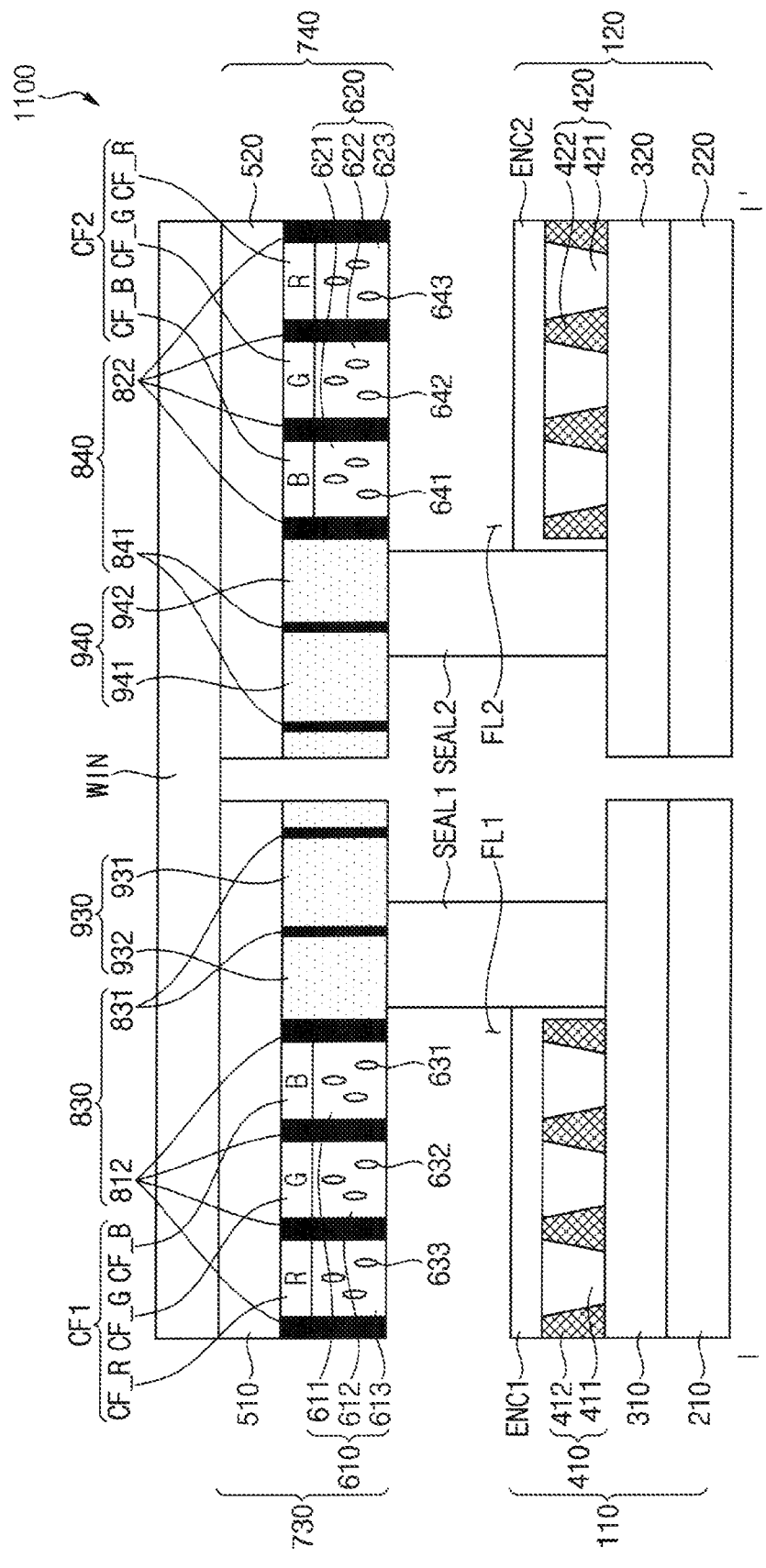
FIG. 12 is a plan view illustrating a tiled display device according to another embodiment.

FIG. 12 is a plan view illustrating a tiled display device according to another embodiment.

Referring to FIG. 12, a tiled display device 1100 according to another embodiment may include a first display panel, a second display panel, and the window WIN. The first display panel may include the first lower structure 110 and a first upper structure 730. The first upper structure 730 may include the first upper substrate 510, the first color filters CF1, a first black matrix pattern 830, and a first photochromic matrix pattern 930. The second display panel may include the second lower structure 120 and a second upper structure 740. The second upper structure 740 may include the second upper substrate 520, the second color filters CF2, a second black matrix pattern 840, and a second photochromic matrix pattern 940. The tiled display device 1100 may be substantially the same as the tiled display device 1000 described with reference to FIG. 4 except for the first black matrix pattern 830, the first photochromic matrix pattern 930, the second black matrix pattern 840, and the second photochromic matrix pattern 940.

In an embodiment, the first black matrix pattern 830 may include patterns extending in the first direction D1 and spaced apart from each other in the second direction D2. For example, the patterns may include first patterns 831 overlapping the first non-display area NDA1 and the second patterns 812 overlapping the first display area DA1.

In an embodiment, the first photochromic matrix pattern 930 may include patterns extending in the first direction D1 and spaced apart from each other in the second direction D2. For example, the patterns may include a third pattern 931 and a fourth pattern 932. The first photochromic matrix pattern 930 may overlap the first non-display area NDA1 and may not overlap the first display area DA1.

In an embodiment, the third pattern 931 may be disposed between the first patterns 831, and the fourth pattern 932 may be disposed between the first pattern 831 and the second pattern 812 that are adjacent to each.

In an embodiment, a first width of each of the first patterns 831 in the second direction D2 may be smaller than a second width of each of the second patterns 812 in the second direction D2. The first width may be smaller than a third width of the third pattern 931 in the second direction D2. The third width of the third pattern 931 and a fourth width of the fourth pattern 932 may be substantially the same.

In an embodiment, the second black matrix pattern 840 may include patterns extending in the first direction D1 and spaced apart from each other in the second direction D2. For example, the patterns may include fifth patterns 841 overlapping the second non-display area NDA2 and sixth patterns 822 overlapping the second display area DA2.

In an embodiment, the second photochromic matrix pattern 940 may include patterns extending in the first direction D1 and spaced apart from each other in the second direction D2. For example, the patterns may include a seventh pattern 941 and an eighth pattern 942. The second photochromic matrix pattern 940 may overlap the second non-display area NDA2 and may not overlap the second display area DA2.

In an embodiment, the seventh pattern 941 may be disposed between the fifth patterns 841, and the eighth pattern 942 may be disposed between the fifth pattern 841 and the sixth pattern 822 that are adjacent to each other.

In an embodiment, a fifth width of each of the fifth patterns 841 in the second direction D2 may be smaller than a second width of each of the sixth patterns 822 in the second direction D2. The fifth width may be smaller than a seventh width of the seventh pattern 941 in the second direction D2. The seventh width of the seventh pattern 941 and an eighth width of the eighth pattern 942 may be substantially the same.

The tiled display device 1100 may include the first patterns 831 having the first width that is relatively narrow, so that the third width and the fourth width may be increased. Accordingly, light may be emitted through the first and second non-display areas NDA1 and NDA2, and a user may not recognize the first and second non-display areas NDA1 and NDA2.

Figure 13:
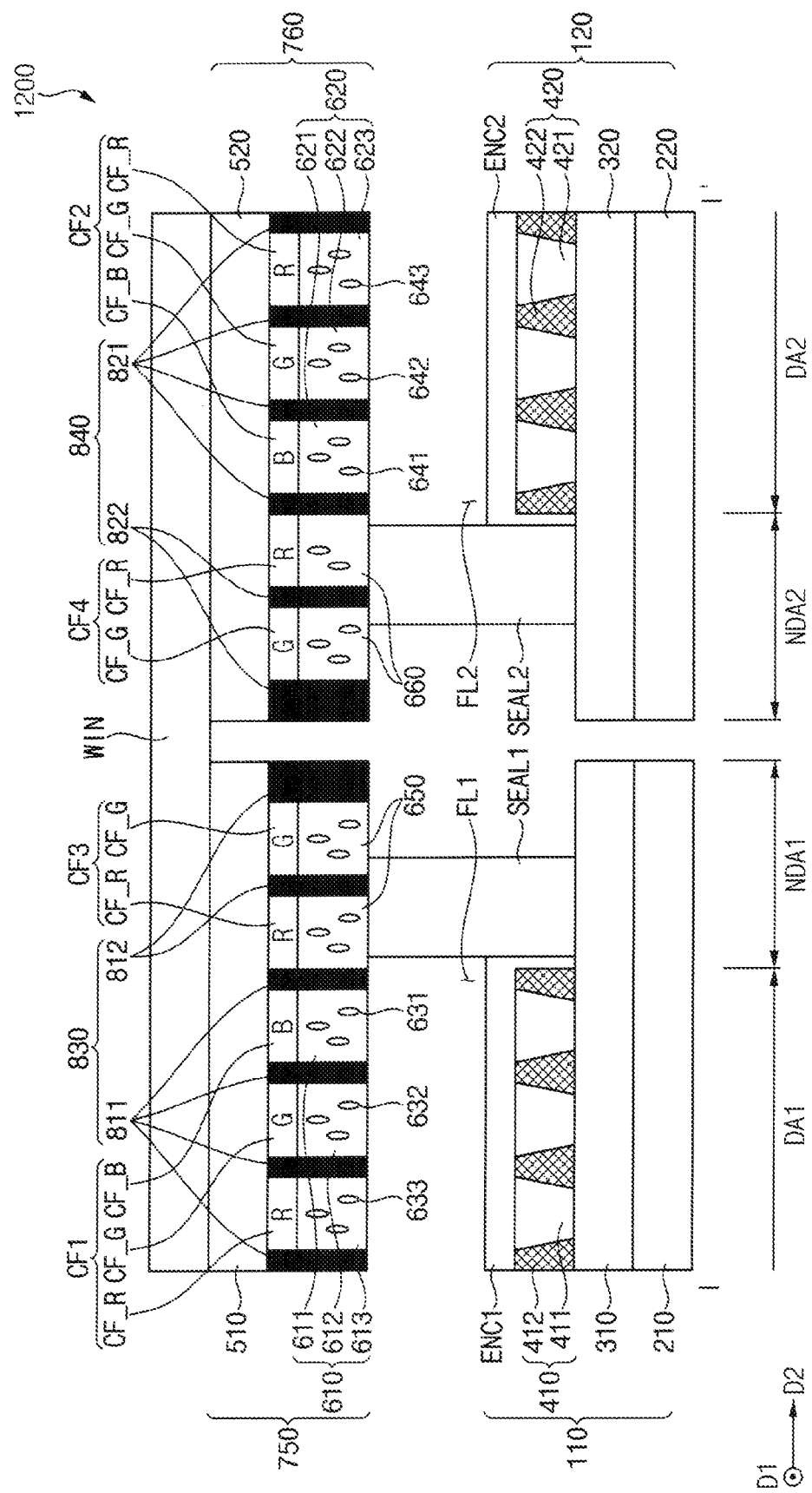
FIG. 13 is a plan view illustrating a tiled display device according to still another embodiment.

FIG. 13 is a plan view illustrating a tiled display device according to still another embodiment.

Referring to FIG. 13, a tiled display device 1200 according to another embodiment may include a first display panel, a second display panel, and the window WIN. The first display panel may include the first lower structure 110 and a first upper structure 750. The first upper structure 750 may include the first upper substrate 510, the first color filters CF1, first additional color filters CF3, first additional color conversion patterns 650, and a first black matrix pattern 810. The second display panel may include the second lower structure 120 and a second upper structure 760. The second upper structure 760 may include the second upper substrate 520, the second color filters CF2, second additional color filters CF4, second additional color conversion patterns 660, and a second black matrix pattern 830. For example, when compared with the tiled display device 1000 described with reference to FIG. 4, the tiled display device 1200 may have a structure in which the first photochromic matrix pattern 910 in FIG. 4 is replaced with the first additional color filters CF3 and the first additional color conversion patterns 650, and the second photochromic matrix pattern 920 in FIG. 4 is replaced with the second additional color filters CF4 and the second additional color conversion patterns 660.

The tiled display device 1200 may include the first and second additional color filters CF3 and CF4 and the first and second additional color conversion patterns 650 and 660 which overlap the first and second non-display areas NDA1 and NDA2, respectively. Accordingly, light may be emitted through the first and second non-display areas NDA1 and NDA2, and a user may not recognize the first and second non-display areas NDA1 and NDA2.

Although the embodiments are described above, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A tiled display device comprising:
    a first display panel including a first display area and a first non-display area adjacent to the first display area; and
    a second display panel including a second display area and a second non-display area disposed between the second display area and the first non-display area, and
    wherein the first display panel comprises:
        a first lower substrate;
        a plurality of emitting diodes disposed on the first lower substrate and overlapping the first display area;
        a first upper substrate including a lower surface facing the first lower substrate;
        a first black matrix pattern disposed on the lower surface of the first upper substrate and overlapping the first non-display area; and
        a first photochromic matrix pattern disposed on the lower surface of the first upper substrate, overlapping the first non-display area, and transmitting light.

2. The tiled display device of claim 1, wherein the first photochromic matrix pattern contacts the first black matrix pattern.

3. The tiled display device of claim 1, wherein the first photochromic matrix pattern does not overlap the first display area.

4. The tiled display device of claim 1, wherein
    the first black matrix pattern includes first patterns that extend in a first direction and are spaced apart from each other in a second direction intersecting the first direction, and
    the first photochromic matrix pattern includes second patterns that extend in the first direction and are spaced apart from each other in the second direction.

5. The tiled display device of claim 4, wherein the first patterns and the second patterns are alternately disposed one after another.

6. The tiled display device of claim 4, wherein a width of each of the first patterns in the second direction is smaller than a width of each of the second patterns in the second direction.

7. The tiled display device of claim 4, wherein the first black matrix pattern further includes third patterns overlapping the first display area.

8. The tiled display device of claim 7, wherein the width of each of the first patterns in the second direction is substantially equal to a width of each of the third patterns in the second direction.

9. The tiled display device of claim 7, wherein the width of each of the first patterns in the second direction is smaller than a width of each of the third patterns in the second direction.

10. The tiled display device of claim 1, wherein the first black matrix pattern blocks light.

11. The tiled display device of claim 1, wherein a color of the first photochromic matrix pattern varies in response to ultraviolet rays irradiated onto the first photochromic matrix pattern.

12. The tiled display device of claim 1, wherein the first display panel further comprises:
- color filters disposed on the lower surface of the first upper substrate, overlapping the first display area, and disposed between patterns of the first black matrix pattern; and
- color conversion patterns overlapping the color filters.

13. The tiled display device of claim 1, further comprising:
- a window disposed on the first display panel and the second display panel, and overlapping the first display area, the first non-display area, the second non-display area, and the second display area.

14. The tiled display device of claim 1, wherein the second display panel comprises:
- a second lower substrate;
- a plurality of emitting diodes disposed on the second lower substrate and overlapping the second display area;
- a second upper substrate including a lower surface facing the second lower substrate;
- a second black matrix pattern disposed on the lower surface of the second upper substrate and overlapping the second non-display area; and
- a second photochromic matrix pattern disposed on the lower surface of the second upper substrate, overlapping the second non-display area, and transmitting light.

* * * * *